US012690276B2

(12) United States Patent
Zhao et al.

(10) Patent No.: US 12,690,276 B2
(45) Date of Patent: Jul. 21, 2026

(54) PHOTOVOLTAIC MODULE BACKSHEET COMPRISING POLYOLEFIN LAYERS

(71) Applicant: ENDURANCE SOLAR SOLUTIONS INC., Nashua, NH (US)

(72) Inventors: Ruofei Zhao, Shanghai (CN); Kurt Van Durme, Geleen (NL); Robert Janssen, Geleen (NL); Alessandro Gualdi, Geleen (NL); Robin Daenen, Geleen (NL)

(73) Assignee: ENDURANCE SOLAR SOLUTIONS INC., Nashua, NH (US)

( * ) Notice: Subject to any disclaimer, the term of this patent is extended or adjusted under 35 U.S.C. 154(b) by 383 days.

(21) Appl. No.: 18/253,836

(22) PCT Filed: May 28, 2021

(86) PCT No.: PCT/CN2021/097006
§ 371 (c)(1),
(2) Date: May 22, 2023

(87) PCT Pub. No.: WO2022/110728
PCT Pub. Date: Jun. 2, 2022

(65) Prior Publication Data
US 2024/0063320 A1 Feb. 22, 2024

(30) Foreign Application Priority Data

Nov. 24, 2020 (WO) ................ PCT/CN2020/131236

(51) Int. Cl.
| | |
|---|---|
| H10F 19/85 | (2025.01) |
| B29C 48/21 | (2019.01) |
| B32B 7/027 | (2019.01) |
| B32B 27/08 | (2006.01) |
| B32B 27/18 | (2006.01) |
| B32B 27/32 | (2006.01) |
| C08L 23/12 | (2006.01) |
| C08L 23/14 | (2006.01) |
| B29C 48/08 | (2019.01) |
| B29K 23/00 | (2006.01) |
| B29L 31/34 | (2006.01) |

(52) U.S. Cl.
CPC ............. *H10F 19/85* (2025.01); *B29C 48/21* (2019.02); *B32B 7/027* (2019.01); *B32B 27/08* (2013.01); *B32B 27/18* (2013.01); *B32B 27/32* (2013.01); *C08L 23/12* (2013.01); *C08L 23/14* (2013.01); *B29C 48/08* (2019.02); *B29K 2023/06* (2013.01); *B29K 2023/12* (2013.01); *B29K 2995/0012* (2013.01); *B29L 2031/3406* (2013.01); *B32B 2250/242* (2013.01); *B32B 2264/1022* (2020.08); *B32B 2270/00* (2013.01); *B32B 2307/308* (2013.01); *B32B 2307/712* (2013.01); *B32B 2307/7376* (2023.05); *B32B 2457/12* (2013.01); *C08L*

*2203/16* (2013.01); *C08L 2203/204* (2013.01); *C08L 2205/025* (2013.01)

(58) Field of Classification Search
None
See application file for complete search history.

(56) References Cited

U.S. PATENT DOCUMENTS

| | | | |
|---|---|---|---|
| 2012/0111407 A1 | 5/2012 | Rummens | |
| 2013/0133726 A1* | 5/2013 | Graichen | B32B 5/028 |
| | | | 156/324 |
| 2014/0000682 A1* | 1/2014 | Zhao | H10F 19/804 |
| | | | 136/251 |
| 2019/0181284 A1 | 6/2019 | Chen et al. | |
| 2019/0296167 A1* | 9/2019 | Van Duijnhoven | B32B 27/40 |

FOREIGN PATENT DOCUMENTS

| | | |
|---|---|---|
| CN | 102470633 A | 5/2012 |
| CN | 111634074 A | 9/2020 |
| EP | 2617568 A1 | 7/2013 |
| EP | 2623314 A1 | 8/2013 |
| WO | 2013135349 A1 | 9/2013 |
| WO | 2015103872 A1 | 7/2015 |
| WO | 2018061036 A1 | 4/2018 |
| WO | 2018087366 A1 | 5/2018 |

OTHER PUBLICATIONS

International Search Report for PCT/CN2021/097006, mailed Aug. 26, 2021, 3 pages.
Written Opinion of the ISA for PCT/CN2021/097006, mailed Aug. 26, 2021, 4 pages.

* cited by examiner

*Primary Examiner* — Samir Shah
(74) *Attorney, Agent, or Firm* — David R. Heckadon; Gordon Rees Scully Mansukhani LLP

(57) ABSTRACT

The present invention relates to a photovoltaic module backsheet comprising, in order: photovoltaic module backsheet comprising a functional layer and a weather-resistant layer, wherein the backsheet is free of fluorinated polymers, characterized in that: i) the functional layer comprises a blend of polyethylene and a polyethylene copolymer, wherein at least 50 wt. % of the functional layer is polyethylene; and ii) the weather-resistant layer comprises, a first sub-layer facing the functional layer and a second sub-layer, wherein a) each of the first sub-layer and the second sub-layer comprise at least 50 wt. % polypropylene; and b) the second sub-layer has a lowest glass transition temperature ($T_g$) below −40° C. The present invention also relates to a process for producing the backsheet and a photovoltaic module comprising the backsheet according to the present invention.

14 Claims, No Drawings

PHOTOVOLTAIC MODULE BACKSHEET COMPRISING POLYOLEFIN LAYERS

This application is the U.S. national phase of International Application No. PCT/CN2021/097006 filed May 28, 2021, which designated the U.S. and claims priority to International Application No. PCT/CN2020/131236 filed Nov. 24, 2020, the entire contents of each of which are hereby incorporated by reference.

The present invention relates to a backsheet for photovoltaic modules. The present invention in particular relates to a backsheet, wherein each layer comprises at least 50 wt. % polyolefin and the backsheet is free of fluorinated polymers. The present invention further relates to a method of making such a backsheet and to photovoltaic modules comprising such a backsheet.

Photovoltaic modules are an important source of renewable energy. They comprise photovoltaic cells that release electrons when exposed to sunlight, thereby generating electricity. Photovoltaic cells, which are usually semiconductor materials, may be fragile and are typically encapsulated in polymeric materials that protect them from physical shocks and scratches. The encapsulated photovoltaic cells are generally further protected on each side by a protective layer that is both electrically insulating and resistant to weathering, abrasion or other physical insults, for the lifetime of the photovoltaic module.

A photovoltaic module has a front surface protection sheet disposed on the side on which sunlight is incident, to protect the surface. This layer is for example a glass layer, which is a rigid outer layer that protects the photovoltaic cells and electronics from the environment while allowing light to pass through and be converted into electricity. The photovoltaic module also has a solar cell rear surface protection sheet called a backsheet, disposed on the opposite side to protect the photovoltaic cells.

The backsheet is typically a multi-layered polymer sheet that protects the PV module from UV, moisture and weather while acting as an electrical insulator. The backsheet must provide protection from environmental conditions for in excess of 20 years. It must therefore be physically and chemically stable over such a time-period. The backsheet often comprises several polymeric layers to provide the above-mentioned properties and to minimize deterioration in the long-term performance of solar cell modules. The several polymeric layers have their own function in the backsheet. Normally a backsheet comprises at least a functional layer facing the cells and a weather-resistant layer facing away from the cells. Typical polymers used in the above-mentioned layers are polypropylene, polyvinylchloride, polyesters such as PET or PBT, fluoro-resins such as PTFE or PVDF and acrylic resins.

Recent developments in photovoltaic backsheets include the use of co-extrusion to produce a multi-layer backsheet. This has the advantage of increasing interlaminar strength and thereby reducing the chance of delamination of the backsheet. Coextrusion requires the polymers in the multiple layers to be sufficiently compatible in terms of bonding and to be processable in coextrusion apparatus.

Another recent development in photovoltaic backsheets is the avoidance of fluorinated polymers. Fluorinated polymers, for example PVF and PVDF are commonly used in photovoltaic backsheets because they have good barrier properties, protecting the module components against environmental conditions. However, it is not possible to recycle fluorinated polymers, meaning that at the end of the lifetime of the photovoltaic module, the fluorinated polymer is a waste product. Moreover, the fluorinated polymer may decompose or be combusted releasing potentially harmful fluorinated compounds into the environment.

Fluorine-free, coextruded backsheets are described in the prior art. Polyamide provides a good barrier against weathering, especially damage by UV radiation. WO2015103872A1 describes a solar module backsheet comprising a weather-resistant layer comprising biaxially oriented polyamide or polyamide stabilized with a heat stabilizer and a UV stabilizer and comprising an inorganic material. WO2018/087366A1 describes a solar module backsheet comprising a polyamide weather-resistant layer. WO2013/135349A1 describes a coextruded solar module backsheet comprising polyamide layers and thermoplastic polyolefin layers, for example flexible polypropylene layers. The polyamide layer is present to improve mechanical integrity, provide an oxygen and $CO_2$ barrier and protect the thermoplastic polyolefin layer from corrosive degradation products. US20190181284 describes a three-layer solar module backsheet, wherein the (outer) weather-resistant layer comprises a polymer network plastic alloy obtained from cross-linking and is preferably polyamide 12. EP2617568A1 describes a photovoltaic module backsheet comprising three layers comprised principally of polyolefin.

In use, solar modules may experience a high degree of temperature variation between daytime and nighttime and also between summer and winter. The daily temperature cycle is particularly pronounced in desert climates, an environment in which solar farms are often located, due to high insolation and non-competition of land for agricultural or other purposes. This temperature cycling across a wide temperature range can lead to cracking of the backsheet, as well as other defects such as discoloration, e.g. yellowing of a white backsheet, and distortion. Cracking in particular leads to two problems: a reduction in electrical insulation and a reduction in water resistance, both of which lead to an increased chance of electrical failure either directly or through corrosion.

Cracking has been identified in particular in two locations on prior art backsheets. Firstly, cracking commonly occurs in the weather-resistant layer directly above the tabbing, or metal wires, present on the photovoltaic cells. The tabbed area is metallic and raised. Secondly, cracking commonly occurs in the weather-resistant layer adjacent to slits cut in the backsheet to allow electrical conduction from the photovoltaic cells to the junction box.

The object of the present invention is to overcome the above-mentioned disadvantages. In particular, the object of the present invention is to reduce cracking of the backsheet above the metal tabbing and adjacent a slit cut in the backsheet.

The present inventors have surprisingly found that a coextruded photovoltaic module backsheet comprising layers which each comprise a majority of polyolefin, and which avoids the use of fluorinated polymers can be produced, which backsheet has good resistance to cracking after being subject to cycling high and low temperatures.

Accordingly, the present invention provides photovoltaic module backsheet comprising a functional layer and a weather-resistant layer, wherein the backsheet is free of fluorinated polymers, characterized in that:

i) the functional layer comprises a blend of polyethylene and a polyethylene copolymer, wherein at least 50 wt. % of the functional layer is polyethylene; and ii) the weather-resistant layer comprises, a first sub-layer facing the functional layer and a second sub-layer, wherein a) each of the first sub-layer and the second sub-layer comprise at least 50 wt. % polypropylene; and b) the second sub-layer has a lowest glass transition temperature ($T_g$) below −40° C.

Further, the present invention provides a process for producing a photovoltaic module backsheet comprising:

i) feeding a functional layer composition, a first sub-layer composition, a second sub-layer composition and, where present, a third sub-layer composition to a multi-layer film coextrusion apparatus; and ii) melting and coextruding the compositions, in the multi-layer film coextrusion apparatus, into a photovoltaic module backsheet in the order: functional layer, first sub-layer, second sub-layer and, where present, third sub-layer.

The present invention further provides a photovoltaic module comprising a solar module backsheet as defined herein.

As used herein, the term polyolefin includes copolymers of an olefin, wherein at least 70% of the monomers are olefinic. For example, the term polyethylene includes copolymers of ethylene, wherein at least 70% of the monomers are polyethylene; and the term polypropylene includes copolymers of propylene, wherein at least 70% of the monomers are polypropylene.

As used herein, wt. % refers to percentage by weight of the specified polymer based on the weight of the layer in which the polymer is present.

The polypropylene used in any of the layers of the present invention may be homopolypropylene, copolypropylene, block copolypropylene or a blend thereof. Suitable comonomers include α-polyolefins, for example 1-butene, 1-hexene, 1-octene and combinations thereof. A polypropylene copolymer preferably comprises at least 75% monomer units derived from propene; more preferably at least 85%; yet more preferably 95%. The polypropylene may be linear or branched.

The polyethylene used in any of the layers of the present invention may be homopolyethylene, copolyethylene, block copolyethylene or a blend thereof. Suitable comonomers include α-polyolefins, for example 1-butene, 1-hexene, 1-octene and combinations thereof. A polyethylene copolymer preferably comprises at least 75% monomer units derived from ethene; more preferably at least 85%; yet more preferably 95%. The polyethylene may be linear or branched.

The weather-resistant layer is located at one face of the backsheet. In use in a photovoltaic module, this layer is exposed to the air, with the opposite face being adjacent an encapsulant for photovoltaic cells and directed toward the photovoltaic cells.

The weather-resistant layer of the present invention comprises, in order, a first sub-layer and a second sub-layer, wherein each of the first sub-layer and the second sub-layer comprise at least 50 wt. % polypropylene. The first sub-layer faces toward the functional layer; the second sub-layer faces away from the functional layer. The sub-layers of the weather-resistant layer may comprise a blend of polypropylene and an alternative polymer. The alternative polymer may be a polyethylene, a polyamide or a polyester. Preferably, the alternative polymer, if present, is a polyethylene.

Preferably, the weather-resistant layer comprises, in order, a first sub-layer, a second sub-layer and a third sub-layer, wherein the third sub-layer comprises at least 50 wt. % polypropylene. Accordingly, The weather-resistant layer of the present invention preferably comprises, in order, a first sub-layer, a second sub-layer and a third sub-layer, wherein each of the first sub-layer, the second sub-layer and the third sub-layer comprise at least 50 wt. % polypropylene. The first sub-layer faces toward the functional layer; the third sub-layer faces away from the functional layer. The sub-layers of the weather-resistant layer may comprise a blend of polypropylene and an alternative polymer. The alternative polymer may be a polyethylene, a polyamide or a polyester. Preferably, the alternative polymer, if present, is a polyethylene.

Typically, the sub-layers of the weather-resistant layer each comprise at least 60 wt. % of polypropylene, more preferably at least 70 wt. % polypropylene. Typically, the sub-layers of the weather-resistant layer each comprise at most 98 wt. % polypropylene. Preferably, the sub-layers of the weather-resistant layer each comprise at most 90 wt. % polypropylene; more preferably at most 80 wt. % polypropylene.

Typically, each of the first sub-layer and the third sub-layer comprise from 70 to 90 wt. % polypropylene. Preferably, each of the first sub-layer and the third sub-layer comprise from 75 to 85 wt. % polypropylene.

Preferably, the polypropylene of the sub-layers of the weather-5 resistant layer is a polypropylene-polyethylene copolymer.

Typically, the composition of the first sub-layer and third sub-layer are similar. For example, the polymer composition of the first sub-layer and third sub-layer are typically identical. Typically the first sub-layer and third sub-layer differ only in the type and/or quantity of additive present in the layer. For example, the amount of 10 inorganic filler or titanium dioxide in the two sub-layers may be different. The third sub-layer may comprise a lower wt. % of inorganic filler than the first sub-layer. The third sub-layer may comprise a higher wt. % titanium dioxide than the first sub-layer. However, typically the first sub-layer and the third sub-layer have an identical chemical composition.

Preferably, the second sub-layer has a lowest glass transition temperature ($T_g$) at least 20° C. lower than the lowest glass transition temperature ($T_g$) of the first sub-layer. Preferably, the second sub-layer has a lowest glass transition temperature ($T_g$) at least 20° C. lower than the lowest glass transition temperature ($T_g$) of the third sub-layer. More preferably, the second sub-layer has a lowest glass transition temperature ($T_g$) at least 20° C. lower than the lowest glass transition temperature ($T_g$) of each of the first sub-layer and the third sub-layer. Typically the second sub-layer has a lowest glass transition temperature at least 30° C. lower than the lowest glass transition temperature ($T_g$) of each of the first sub-layer and the third sub-layer.

In one embodiment, a photovoltaic module backsheet comprises, in order: a functional layer and a weather-resistant layer, wherein the backsheet is free of fluorinated polymers, characterized in that:

i) the functional layer comprises a blend of polyethylene and a polyethylene copolymer, wherein at least 50 wt. % of the functional layer is polyethylene; and ii) the weather-resistant layer comprises, in order, a first sub-layer, a second sub-layer and a third sub-layer, wherein a) each of the first sub-layer, the second sub-layer and the third sub-layer comprise at least 50 wt. % polypropylene; and b) the second sub-layer has a lowest glass transition temperature ($T_g$) at least 20° C. lower than the lowest glass transition temperature ($T_g$) of each of the first sub-layer and the third sub-layer.

The second sub-layer has a lowest glass transition temperature ($T_g$) below −40° C. Preferably the second sub-layer has a lowest glass transition temperature below −50° C. More preferably, the second sub-layer has a lowest glass transition temperature below −60° C. 5 Typically, the second sub-layer comprises a blend of polypropylene with a polyolefin elastomer. Typically, the second sub-layer comprises from 10 wt. % to 50 wt. % polyolefin elastomer. Preferably, the second sub-layer comprises from 20 wt. % to 40 wt. % polyolefin elastomer. More preferably, the connecting layer comprises from 25 wt. % to 35 wt. % polyolefin elastomer. The polyolefin elastomer contributes to the lower $T_g$ of the second sub-layer, compared with that of the first and third sub-layers.

Without wishing to be bound by any theory, the present inventors consider that the presence of a sub-layer with a low $T_g$ provides some flexibility to the backsheet at low temperatures. During the thermal cycling this can reduce stress intensity in the backsheet by allowing movement of the weathering layer. For example it can allow relative movement between the first and third sub-layers. The effect is particularly noticeable if the second sub-layer has a lowest glass transition temperature ($T_g$) below −40° C., when the TC200 test described below is used, in which the minimum temperature reached is −40° C.

Each sub-layer of the weather-resistant layer typically comprises a UV stabilizer. A typical UV stabilizer is a hindered amine light stabilizer.

Each sub-layer of the weather-resistant layer typically comprise one or more antioxidants. Typically, each sub-layer comprises from 0.1 to 5 wt. % antioxidants. Preferably, each sub-layer comprises from 0.2 to 4 wt. % antioxidants, for example 0.75 wt. %, 1.0 wt. %, 1.5 wt. %, 2.0 wt. % or 3.0 wt. %.

Suitable primary antioxidants include a phenolic antioxidant or an aromatic amine antioxidant. The primary antioxidant is a radical scavenger. Typically, it is a phenolic antioxidant. Preferably the primary antioxidant is a phenolic antioxidant and is selected from benzenepropanoic acid, 3,5-bis(1,1-dimethylethyl)-4-hydroxy-octadecyl ester; 2,5, 7,8-Tetra-methyl-2-(4',8',12'-tri-methyl-tri-decyl)-chroman-6-ol; N,N'-Hexamethylene bis (3,5-di-t-butyl-4-hydroxyhydrocinnamamide); ethylenebis (oxyethylene) bis (3-t-butyl-4-hydroxy-5-methylhydrocinnamate); hexamethylenebis (3,5-di-t-butyl-4-hydroxycinnamate); phenol, 4,4'4''-[(2,4,6-trimethyl-1,3,5-benzenetriyl)-tris-(methylene)]-tris-2,6-bis (1,1-dimethylethyl)-; bis-[3,3-bis-(4'-hydroxy-3'-t-butylphenyl butanoic acid]-glycol ester; tris(3,5-di-t-butyl-4-hydroxy benzyl) isocyanurate; 3,9-bis(2-(3-(3-tert-butyl-4-hydroxy-5-methylphenyl)propionyloxy-1,1-dimethylethyl)-2,4,8,10-tetraoxaspiro[5.5]undecane; 1,3,5-Tris (4-t-butyl-3-hydroxy-2,6-dimethylbenzyl)-1,3,5-triazine-2,4,6-(1H,3H, 5H)-trione; and tetrakis [methylene (3,5-di-t-butyl-4-hydroxyhydrocinnamate)] methane 3-(3,5-di-t-butyl-4-hydroxy-phenyl) propion acid ester with 1,3,5-tris (2-hydroxy-ethyl)-iso-cyanurate.

Suitable secondary antioxidants include a trivalent phosphorus containing antioxidant or a thioether containing antioxidant. The secondary antioxidant is typically a hydroperoxide decomposer. Typically, it is a thioether containing antioxidant. Preferably, the secondary antioxidant is a thioether antioxidant, and is selected from dilauryl thiodipropionate; distearyl thiodipropionate; pentaerythrityl tetrakis (8-laurylthiopropionate); and propanoic acid, 3,3'-thio-bis-, 1,1'-dimethyl ester, polymer with 1,4-cyclohexanedimethanol, octadecyl ester.

Each sub-layer of the weather-resistant layer may comprise one or more further additives in addition to the UV-stabilizer, primary antioxidant and secondary antioxidant. Example of the additives include UV absorbers, thermal stabilizers and/or hydrolysis stabilizers. When such further additives are used, each sub-layer of the weather-resistant layer comprises from 0.05 to 10 wt. % more preferably to 5 wt. % additives.

Each sub-layer of the weather-resistant layer according to the present invention may further comprise an inorganic filler. Examples of these inorganic fillers are calcium carbonate, titanium dioxide, barium sulfate, mica, talc, kaolin, ZnO, ZnS, glass microbeads and glass fibers. When such fillers are used, each sub-layer of the weather-resistant layer comprises from 0.05 to 20 wt. % of filler based on the total weight of the sub-layer.

Each sub-layer of the weather-resistant layer according to the present invention may further comprise a white pigments such as $TiO_2$, ZnO or ZnS. This is typically added to increase backscattering of sunlight leading to increased efficiency of the solar module. Each sub-layer of the weather-resistant layer according to the present invention may further comprise a black pigment such as carbon black. This is typically added for aesthetic reasons.

The weather-resistant layer typically has a thickness of from 100 to 500 µm. Preferably, the weather-resistant layer has a thickness of from 100 to 400 µm. More preferably, the weather-resistant layer has a thickness of from 150 to 300 µm; yet more preferably from 200 to 250 µm.

The functional layer is located at one face of the backsheet. In use in a photovoltaic module, this layer is adjacent an encapsulant for photovoltaic cells and directed toward the photovoltaic cells. One function of the functional layer of the backsheet is adhesion to the encapsulant. Another function is to reflect light onto the photovoltaic cells.

The functional layer of the present invention comprises at least 50 wt. % polyolefin. The functional layer comprises a blend of polyethylene and a polyethylene copolymer.

Typically, the functional layer comprises at least 50 wt. % of polyethylene. Preferably, the functional layer comprises at least 60 wt. % of polyethylene, more preferably at least 70 wt. %, even more preferably at least 80 wt. % polyethylene or even at least 90 wt. % polyethylene. The weather-resistant layer comprises at most 98 wt. % polyethylene. Preferably, the weather-resistant layer comprises at most 95 wt. % polyethylene; more preferably at least 92 wt. % polyethylene, or even 90 wt. % polyethylene.

Typically, the functional layer comprises from 1 to 30 wt. % of polypropylene. Preferably, it comprises from 5 to 15 wt. % polypropylene. Polypropylene serves to increase the temperature resistance of the functional layer, thus reducing delamination or thermal shrinkage under high operational temperature.

Preferably, the functional layer comprises a ternary blend of polypropylene, polyethylene and a polyethylene copolymer. Preferably, the polyethylene is linear low-density polyethylene.

Typically, the polyethylene copolymer is an ethylene acrylate copolymer, preferably ethylene methacrylate copolymer, for example Elvaloy AC 1820 from DuPont. Typically, the functional layer further comprises a vinyl acetate copolymer.

Typically, the ethylene methacrylate polymer is present in an amount of from 1 to 40 wt. %; preferably from 20 to 30 wt. %. Ethylene methacrylate copolymer serves to increase adhesion between the functional layer and the EVA encapsulant.

Typically, the functional layer comprises a UV stabilizer, primary antioxidant, secondary antioxidant, UV absorber, thermal stabilizer and/or hydrolysis stabilizer, inorganic filler or pigment as defined above with respect to the weather-resistant layer.

The functional layer typically has a thickness of from 10 to 50 µm. Preferably, the functional layer has a thickness of from 20 to 40 µm; more preferably from 25 to 30 µm. The functional layer typically has a thickness of less than 20% of the thickness of the photovoltaic module backsheet. Preferably, the functional layer has a thickness of less than 15% of the thickness of the photovoltaic module backsheet. More preferably, the functional layer has a thickness of less than 10%, or even less than 5%, of the photovoltaic backsheet. The photovoltaic module backsheet typically has a thickness of from 150 to 500 µm. Preferably, the photovoltaic module backsheet has a thickness of from 200 to 400 µm; more preferably from 250 to 350 µm, for example about 300 µm.

The photovoltaic backsheet of the present invention may comprise layers other than a functional layer and weather-resistant layer. For example, the backsheet may further comprises a connecting layer, located between the functional layer and the weather-resistant layer. If present, the connecting layer typically comprises polyethylene. The connecting layer more preferably comprises a polyethylene copolymer.

Typically, the connecting layer comprises at least 50 wt. % of polyethylene. Preferably, the connecting layer comprises at least 60 wt. % of polyethylene, more preferably at least 70 wt. %, even more preferably at least 80 wt. % polyethylene or even at least 90 wt. % polyethylene. The connecting layer comprises at most 98 wt. % polyethylene. Preferably, the connecting layer comprises at most 95 wt. % polyethylene; more preferably at least 92 wt. % polyethylene, or even 90 wt. % polyethylene.

The connecting layer may comprise, for example, a maleic anhydride grafted polyolefin such as maleic anhydride grafted polyethylene or maleic anhydride grafted polypropylene, an ethylene-acrylic acid copolymer an ethylene acrylic acid terpolymer or an ethylene-acrylic ester-maleic anhydride terpolymer.

The connecting layer preferably comprises a polyethylene-polypropylene block copolymer. More preferably, it comprises a polyethylene-polypropylene block copolymer with polyolefin blend. Preferably, the polypropylene is not grafted.

The connecting layer may comprise a modifier. For example the connecting layer may comprise a polyolefin elastomer. The connecting layer typically comprises up to 30 wt % polyolefin elastomer. Preferably, the connecting layer comprises from 10 to 20 wt % polyolefin elastomer. More preferably, the connecting layer comprises about 25 wt. % polyolefin elastomer.

Typically, the connecting layer comprises a UV stabilizer, primary antioxidant, secondary antioxidant, UV absorber, thermal stabilizer and/or hydrolysis stabilizer, inorganic filler or pigment as defined above with respect to the weather-resistant layer.

The connecting layer typically has a thickness of from 10 to 50 µm. Preferably, the connecting layer has a thickness of from 20 to 40 µm; more preferably from 25 to 30 µm.

Suitable polymer materials for photovoltaic cell encapsulants typically possess a combination of characteristics such as high impact resistance, high penetration resistance, good ultraviolet (UV) light resistance, good long term thermal stability, adequate adhesion strength to glass and/or other rigid polymeric sheets, high moisture resistance, and good long term weatherability. Examples of encapsulants are ionomers, ethylene vinyl acetate (EVA), poly(vinyl acetal), polyvinylbutyral (PVB), thermoplastic polyurethane (TPU), polyvinylchloride (PVC), metallocene-catalyzed linear low density polyethylenes, polyolefin block elastomers, poly (ethylene-co-methyl acrylate) and poly(ethylene-co-butyl acrylate), silicone elastomers or epoxy resins. EVA is the most commonly used encapsulant material. EVA sheets are usually inserted between the solar cells and the top surface (called front encapsulant) and between the solar cells and the rear surface (called a back encapsulant).

The present invention provides a photovoltaic module comprising the photovoltaic module backsheet as defined herein. A photovoltaic module comprises at least the following layers in order of position from the front sun-facing side to the back non-sun-facing side: (1) a transparent pane (representing the front sheet), (2) a front encapsulant, (3) a solar cell layer, (4) a back encapsulant and (5) the backsheet according to the present invention.

The front sheet is typically either a glass plate or in case of flexible modules, a polymeric sheet having high transmission of light.

The present invention further relates to a process for preparing a photovoltaic module backsheet. A preferred process comprises:

i) feeding a functional layer composition, a connecting layer composition, a first sub-layer composition, a second sub-layer composition and a third sub-layer composition to a multi-layer film coextrusion apparatus; and ii) melting and coextruding the compositions, in the multi-layer film coextrusion apparatus, into a photovoltaic module backsheet in the order: functional layer, connecting layer, first sub-layer, second sub-layer, third sub-layer.

The invention is now demonstrated by means of a series of examples and comparative experiments.

EXAMPLES

Method for Manufacturing a Photovoltaic Backsheet:

Material of a first sub-layer, second sub-layer and third sub-layer of a weather-resistant layer; a connecting layer and a functional layer were respectively pelletized by an extruder to obtain plastic pellets of respective layers. Pellets of the respective layers were added to multiple inputs of a multi-layer extruder (HRPC-1000 from Tianjin Hengrui Plastic Machinery Co., Ltd.), melt-extruded at 230° C., flowed through an adapter and a die, cooled by a cooling roller and shaped to manufacture the multi-layer back sheet. The layers were, in order, functional layer, connecting layer, weather resistant layer. Where the weather resistant layer comprised multiple sub-layers, the first sub-layer was adjacent the connecting layer and the second sub-layer was located between the first and third sub-layers. The composition of the different layers in the multilayer backsheets are given in Table 1.

TABLE 1

| Example no. | Weather-resistant layer (thickness) | Connecting layer (thickness) | Functional layer (thickness) |
|---|---|---|---|
| Ex. 1 | Three sub-layers:<br>First sub-layer: 79 parts of polypropylene copolymer, 10 parts of titanium dioxide, 10 parts of talcum powder, additives (240 µm).<br>Second sub-layer: 70 parts of polypropylene copolymer, 30 parts of polyolefin elastomer, additives (25 µm)<br>Third sub-layer: 79 parts of polypropylene copolymer, 10 parts of titanium dioxide, 10 parts of talcum powder, additives (30 µm). | 70 parts of polypropylene copolymer, 30 parts of polyolefin elastomer, additives (25 µm) | 55 parts of polyethylene, 10 parts of polypropylene copolymer, 25 parts of ethylene copolymer, 10 parts of titanium dioxide, additives (30 µm) |
| Ex. 2 | Three sub-layers:<br>First sub-layer: 75 parts of polypropylene copolymer, 5 parts of polyolefin elastomer, 10 parts of titanium dioxide, 10 parts of talcum powder, additives (240 µm).<br>Second sub-layer: 70 parts of polypropylene copolymer, 30 parts of polyolefin elastomer, additives (25 µm)<br>Third sub-layer: 75 parts of polypropylene copolymer, 5 parts of polyolefin elastomer, 10 parts of titanium dioxide, 10 parts of talcum powder, additives (30 µm). | 70 parts of polypropylene copolymer, 30 parts of polyolefin elastomer, additives (25 µm) | 55 parts of polyethylene, 10 parts of polypropylene copolymer, 25 parts of ethylene copolymer, 10 parts of titanium dioxide, additives (30 µm) |
| Comp. Ex. 1 | Single layer: 79 parts of polypropylene copolymer, 10 parts of titanium dioxide, 10 parts of talcum powder, additives (300 µm). | 70 parts of polypropylene copolymer, 30 parts of polyolefin elastomer, additives (25 µm) | 55 parts of polyethylene, 10 parts of polypropylene copolymer, 25 parts of ethylene copolymer, 10 parts of titanium dioxide, additives (25 µm) |
| Comp. Ex. 2 | Single layer: 75 parts of polypropylene copolymer, 5 parts of polyolefin elastomer, 10 parts of titanium dioxide, 10 parts of talcum powder, additives (300 µm). | 70 parts of polypropylene copolymer, 30 parts of polyolefin elastomer, additives (25 µm) | 55 parts of polyethylene, 10 parts of polypropylene copolymer, 25 parts of ethylene copolymer, 10 parts of titanium dioxide, additives (25 µm) |

Method for Manufacturing a Photovoltaic Module:

A module stack was produced by laying the following in the specified order: a sheet of solar glass (1644*985 mm) SM from FSG, a sheet of EVA encapsulant (1644*985*0.45 mm) F406P from Hangzhou First, strings of photovoltaic cells, a second sheet of EVA encapsulant (1644*985*0.45 mm) F806P from Hangzhou First and a photovoltaic backsheet (1654*995 mm). Slits were first cut in the backsheet for electrical contact. The stack was consolidated in a solar module laminator: an SM Innotech Profilam 21-10, equipped with additional oil circulation system and pin lift system. The lamination protocol was 300 s evacuation and melting; 60 s pressure ramp up time; 600 s pressing/curing time at 800 mbar; 60 s pressure release time. A junction box was attached with sealant and an aluminium frame affixed to form a solar photovoltaic module.

Measurements

Glass transition temperature ($T_g$) of the material of the sub-layer was measured by differential scanning calorimetry. A heating rate of 10K/minute was used. In Ex. 1, the $T_g$ of the first and third sublayers was approximately −20° C. and the $T_g$ of the second sub-layer was approximately −60° C. In Ex. 2, the $T_g$ of the first sublayer was approximately −20° C. and the $T_g$ of the second sub-layer was approximately −60° C.

The photovoltaic module was subjected to a thermal cycling test. Thermal cycling was carried out according to IEC 61215:2016, test MQT11 using Votsch VC[3] 7018 apparatus. The temperature was cycled between −40° C. and +85° C. with a dwell time of 10 minutes at each temperature. For TC200, 200 cycles were carried out. For TC400 and TC600, 400 and 600 cycles were carried out respectively. The results are presented in Table 2.

TABLE 2

| Example No. | Test | Observation above tabbing | Observation adjacent slit end |
|---|---|---|---|
| Comp. Ex. 1 | TC200 | Visible cracks through weather-resistant layer | Visible cracks through weather-resistant layer |
| Comp. Ex. 2 | TC200<br>TC400 | No visible cracks in external layer<br>Visible cracks through weather-resistant layer | No visible cracks in external layer<br>Not inspected |

TABLE 2-continued

| Example No. | Test | Observation above tabbing | Observation adjacent slit end |
|---|---|---|---|
| Ex. 1 | TC200, TC400, TC600 | No visible cracks in external layer | No visible cracks in external layer |
| Ex. 2 | TC200, TC400 | No visible cracks in external layer | No visible cracks in external layer |

The backsheets of Ex. 1 and Ex 2. showed no visible cracks in the external layer, either above the tabbing or adjacent to the slit end after TC200, TC400 or (for Ex. 1) TC600. Conversely, Comp. Ex. 1 showed cracking through the weather-resistant layer at both of these locations after TC200. Comp. Ex. 2 showed cracking through the weather-resistant layer above the tabbing after TC400. This indicates an improvement by using a weather-resistant layer comprising three sub-layers, wherein the second sub-layer has a $T_g$ below −40° C. and a $T_g$ which is 40° C. lower than that of the first and third sub-layers.

The invention claimed is:

1. A coextruded photovoltaic module backsheet comprising a functional layer and a weather-resistant layer, wherein the backsheet is free of fluorinated polymers, characterized in that:

i) the functional layer comprises a blend of polyethylene and a polyethylene copolymer, wherein at least 50 wt. % of the functional layer is polyethylene, and wherein the polyethylene copolymer is an ethylene acrylate copolymer from 1 to 40% wt.; and ii) the weather-resistant layer comprises, a first sub-layer facing the functional layer and a second sub-layer, wherein a) each of the first sub-layer and the second sub-layer comprise at least 50 wt. % polypropylene; and b) the second sub-layer has a lowest glass transition temperature ($T_g$) below −40° C., wherein the second sub-layer comprises from 20 wt. % to 40 wt. % polyolefin elastomer.

2. The photovoltaic module backsheet according to claim 1, wherein the second sub-layer has a lowest glass transition temperature ($T_g$) at least 20° C. lower than the lowest glass transition temperature ($T_g$) of the first sub-layer.

3. The photovoltaic module according to claim 1, wherein the weather-resistant layer comprises, in order, a first sub-layer, a second sub-layer and a third sub-layer, wherein the third sub-layer comprises at least 50 wt. % polypropylene.

4. The photovoltaic module according to claim 3, wherein the second sub-layer has a lowest glass transition temperature ($T_g$) at least 20° C. lower than the lowest glass transition temperature ($T_g$) of the third sub-layer.

5. The photovoltaic module backsheet according to claim 3, wherein each of the first sub-layer and the third sub-layer comprise from 70 wt. % to 90 wt. % polypropylene.

6. The photovoltaic module backsheet according to claim 3, wherein the first sub-layer and the third sub-layer have an identical chemical composition.

7. The photovoltaic module backsheet according to claim 1, wherein the second sub-layer comprises a blend of polypropylene with a polyolefin elastomer.

8. The photovoltaic module backsheet according to claim 1, which further comprises a connecting layer, located between the functional layer and the weather-resistant layer.

9. The photovoltaic module backsheet according to claim 1, wherein functional layer comprises a ternary blend of polypropylene, polyethylene and a polyethylene copolymer.

10. The photovoltaic module backsheet according to claim 1, wherein the functional layer has a thickness of from 10 to 50 μm.

11. The photovoltaic module backsheet according to claim 1, wherein the weather-resistant layer has a thickness of from 100 to 500 μm.

12. The photovoltaic module comprising a photovoltaic module backsheet as defined in claim 1.

13. A process for producing a photovoltaic module backsheet as defined in claim 1 comprising:

i) feeding the functional layer composition, the first sub-layer composition, the second sub-layer composition and, where present, a third sub-layer composition to a multi-layer film coextrusion apparatus; and ii) melting and coextruding the compositions, in the multi-layer film coextrusion apparatus, into a photovoltaic module backsheet in the order: functional layer, first sub-layer, second sub-layer and, where present, third sub-layer.

14. A process according to claim 13 comprising:

i) feeding the functional layer composition, a connecting layer composition, the first sub-layer composition, the second sub-layer composition and a third sub-layer composition to a multi-layer film coextrusion apparatus; and ii) melting and coextruding the compositions, in the multi-layer film coextrusion apparatus, into a photovoltaic module backsheet in the order: functional layer, connecting layer, first sub-layer, second sub-layer, third sub-layer.

* * * * *